United States Patent [19]
Nakao

[11] Patent Number: 6,049,237
[45] Date of Patent: Apr. 11, 2000

[54] VOLTAGE/CURRENT CONVERTING CIRCUIT AND PLL CIRCUIT INCLUDING THIS CIRCUIT

[75] Inventor: Takehiko Nakao, Yokohama, Japan

[73] Assignee: Kabushiki Kaisha Toshiba, Kanagawa-ken, Japan

[21] Appl. No.: 08/891,559

[22] Filed: Jul. 11, 1997

[30] Foreign Application Priority Data

Jul. 12, 1996 [JP] Japan ................................ 8-183657

[51] Int. Cl.⁷ .................................................. H02M 11/00
[52] U.S. Cl. ............................ 327/103; 327/543; 327/157
[58] Field of Search ..................................... 327/103, 538, 327/540, 541, 543, 157; 331/17, 57

[56] References Cited

U.S. PATENT DOCUMENTS

| | | | |
|---|---|---|---|
| 5,550,495 | 8/1996 | Fotouhi | 327/103 |
| 5,687,201 | 11/1997 | McClellan et al. | 375/374 |
| 5,710,527 | 1/1998 | Yaguchi et al. | 327/543 |
| 5,740,213 | 4/1998 | Dreyer | 375/374 |

*Primary Examiner*—Timothy P. Callahan
*Assistant Examiner*—Eunja Adolphe
*Attorney, Agent, or Firm*—Loeb & Loeb, LLP

[57] ABSTRACT

A voltage/current converting circuit whose gain is hard to be influenced by the fluctuation in process has a constant current source for generating a constant current; a shunt circuit for flowing the constant current generated by said constant current source to a first and second current paths, the first current path flowing a first current corresponding to an input voltage, and the second current path flowing a second current defined as a difference between the constant current and the first current; and an output circuit for taking out a current bearing a predetermined relationship with the first current.

13 Claims, 3 Drawing Sheets

VOLTAGE/CURRENT CONVERTING CIRCUIT AND PLL CIRCUIT INCLUDING THIS CIRCUIT

BACKGROUND OF THE INVENTION

1. Field of the Invention

The present invention relates to a voltage/current converting circuit for converting a voltage into an electric current, and to a PLL circuit including this circuit.

2. Related Background Art

Over the recent years, in a field where a high-speed operation is demanded as a speed and a quantity in data communications and an operation speed of a microprocessor increase, what has been re-recognized is a significance of analog circuits. Among these circuits, mainly a synchronous circuit such as a PLL (Phase Locked Loop) circuit is treated as a significant macro block, and a multiplicity of analog circuits are employed in the PLL circuit.

FIG. 3 is a block diagram showing a circuit configuration of a typical PLL circuit. In this PLL circuit, a reference clock signal REFCLK is supplied to a phase comparator 1, and output voltage thereof is supplied to a charge pump circuit (CHP) 2, wherein the voltage is converted into an electric current. This current passes through a low-pass filter (LPF) 3 composed of two resisters and a capacitor, and a voltage is generated by the capacitor. This voltage is converted into an electric current by a voltage/current converting circuit 4, and an ICO 5 generates a frequency corresponding to this current. This frequency is divided by a frequency divider 6, then supplied to the phase comparator 1 and compared with the reference clock signal, thereby obtaining a fixed frequency.

A stable operation of this PLL circuit must involve an precise conversion of the voltage into the Current.

FIG. 4 shows a conventionally known voltage/current converting circuit used in the PLL circuit.

In this voltage/current converting circuit, an output of an operational amplifier 31 with a non-inverting terminal serving as an input terminal, is supplied to a gate of an N-channel MOS transistor QN33, and a source of the N-channel MOS transistor QN33 is grounded through a resistor R32. A drain of the N-channel MOS transistor QN33 is connected to a drain of a P-channel MOS transistor QP34 with its source connected to e power supply. A connecting point between the resistor R32 and the source of the N-channel MOS transistor QN33, is connected to an inverted input terminal of the operational amplifier 31. A common connecting point between the drain of the N-channel MOS transistor QN33 and the drain of the P-channel MOS transistor QP34, is connected to a gate of the P-channel MOS transistor QP34, and a gate electrode thereof serves as an output terminal.

Next, an operation of this voltage/current converting circuit will be explained.

This voltage/current converting circuit generates the current at the output terminal by applying, to both terminals of the resistor R32, the same voltage as a voltage applied to an input terminal IN.

When the voltage applied to the input terminal IN is higher than a voltage NS1 of the connecting point between the resistor R32 and the N-channel MOS transistor QN33, a voltage of an output OP0 of the operational amplifier 31 increases. This voltage is supplied to the gate of the N-channel MOS transistor QN33, and hence a driving force thereof augments while an electric potential of a terminal NS1 increases with an inclination toward $V_{DD}$. Reversely when the voltage of the terminal IN is lower than the voltage of the terminal NS1, the potential of the output OP0 of the operational amplifier 31 reduces. As a result, the driving force of the N-channel MOS transistor QN33 decreases, and therefore the potential of the terminal NS1 decreased with an inclination toward GND. Thus, the control is conducted to equalize the voltage of the terminal IN to the potential of the terminal NS1.

On the other hand, an output current Iout supplied by the P-channel MOS transistor QP34 is equal to the current flowing across the resistor R32 and therefore given by:

$$Iout = Vin/R \quad (1)$$

where Vin is the voltage applied to the input terminal IN, and R is the resistance value of the resistor R32. The current proportional to the input voltage can-be thereby fetched.

In PLL circuits used particularly in communications field, no dispersion in gain, which is caused depending on products, is required. It is herein known that a principal cause of the dispersion in gain is a scatter in element characteristic due to dimensional irregularity created in terms of a manufacturing process.

For example, in the circuit shown in FIG. 3, when the resistor R32 is actualized in a chip, the resistance value has a 2-fold difference between the maximum and the minimum, considering that a sheet resistance fluctuates on the order of ±30% depending on the process. As a result, it follows that the gain of the voltage/current converting circuit comes to have a 2-fold fluctuation width according to the formula (1).

Accordingly, it is in fact difficult to prevent the gain of the conventional voltage/current converting circuit from fluctuating due to the fluctuation in process.

The resistance is provided outwardly of the chip in order to avoid such a large fluctuation. In the case of a so-called exterior fitting type described above, however, it is required that pins be prepared for connecting the resistor. It is still impossible to increase the number of such pins in the great majority of integrated circuits that have already been deficient in the pins.

SUMMARY OF THE INVENTION

It is a primary object of the present invention, which was contrived to obviate the problems given above, to provide a voltage/current converting circuit and a PLL circuit including this voltage/current converting circuit, wherein a gain is hard to fluctuate due to a fluctuation in process, and, besides, no connection of outer elements is needed To accomplish the above object, according to a first aspect of the present invention, a voltage/current converting circuit comprises a constant current source for generating a constant current, a shunt circuit for flowing the constant current generated by the constant current source to two current paths, i.e., a first current path through which to flow a first current corresponding to an input voltage, and a second current path through which to flow a second current defined as a difference between the constant current and the first current, and an output circuit for fetching a current bearing a predetermined relationship with the first current.

The output circuit may be constructed to include a current mirror circuit or a current control circuit for controlling an output current so that a difference between the first current and the output current becomes 0.

According to such a construction, an output resistor is unnecessary with a difficulty of being influenced by fluctuations in process.

According to a second aspect of the present invention, a PLL circuit including the thus constructed voltage/current converting circuit, comprises a phase comparing unit for comparing a reference signal with a phase of an output signal, a charge pump circuit for converting an output of this phasic comparison into an electric current, a low-pass filter circuit for generating a voltage from a current output of the charge pump circuit, and an oscillator for generating a frequency based on the current of the voltage/current converting circuit.

This PLL circuit has no resistor that might become a factor of causing fluctuations in gain due to the fluctuations in the process, and a stable operation can be thereby obtained.

DESCRIPTION OF THE PREFERRED EMBODIMENTS

Figure 1:
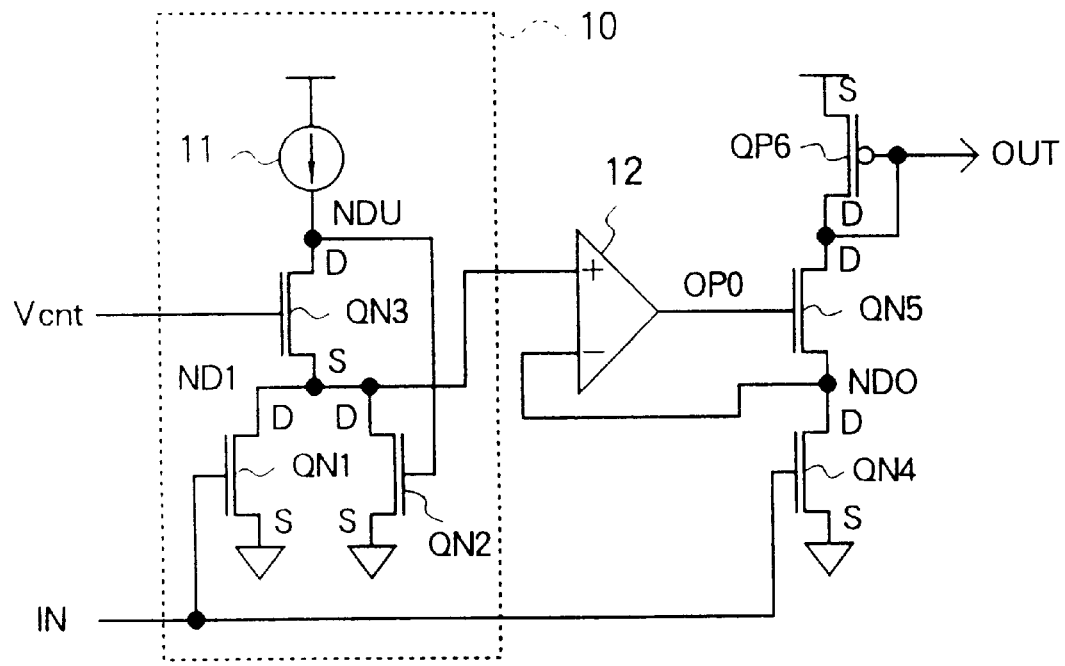
FIG. 1 is a circuit diagram showing a construction of a voltage/current converting circuit in a first embodiment of the present invention.

FIG. 1 illustrates a voltage/current converting circuit in one embodiment of the present invention. A block 10 surrounded by a dotted line is a current shunt circuit. This shunt circuit includes an N-channel MOS transistor QN3 with its drain connected to a constant current source 11 and its gate supplied with a control voltage $V_{cnt}$, and two pieces of N-channel MOS transistor QN1 and N-channel MOS transistor QN2 with their drains connected to a source (an input node ND1) of the transistor QN3. Sources of these transistors QN1, QN2 are each grounded. A gate of the transistor QN1 is connected to an input terminal IN, and a gate of the transistor QN2 is connected to an output point of the constant current source 11.

The node ND1 is connected to a non-inverted input terminal of an operational amplifier 12. An output OP0 of this operational amplifier 12 is supplied to a gate of an N-channel MOS transistor QN5, and a source thereof is connected to an inverted input terminal of the operational amplifier 12.

A source of the N-channel MOS transistor QN5 is connected to a drain of the N-channel MOS transistor QN4, a source thereof is grounded, and its gate is connected to the input terminal IN.

Further, a drain of the transistor QN5 is connected to a drain of a P-channel MOS transistor QP6. A source of this transistor QP6 is connected to a power supply, and its gate is connected to the drain and serves as an output terminal OUT.

Note that the constant current circuit shown herein is a typical circuit generating a constant current based on a threshold voltage of the MOS transistor of the same conductivity as that of the first MOS transistor.

Given next is an explanation of an operation of the thus constructed voltage/current converting circuit.

The constant current source 11 supplies the constant current. The transistors QN1 and QN2 being connected in common to the transistor QN3, however, it follows that two current paths might exist.

The gate of the transistor QN1 is supplied with the input voltage IN, and this input voltage is 0–5V when the transistor is of a 5V system. This transistor QN1 flows a current proportional to the input voltage, and, for this purpose, it is required that the voltage of the input node ND1 be fixed low and the transistor QN1 be operated in a triode area, i.e., in a non-saturation area. On the other hand, the transistor QN2 flows a sufficient current and is therefore required to be operate in a pentode area The current of the constant current source 11 and a driving force of the N-channel MOS transistor QN3 are set to satisfy those requirements.

As a result, the N-channel MOS transistor QN3 flows the current supplied from the constant current circuit 11 in the pentode area, and hence a gate-to-source voltage is kept constant. If the control voltage $V_{cnt}$ is set so as not to depend on the voltage of the input IN, the terminal ND1 can be fixed at a low voltage. At this time, the N-channel MOS transistor QN3 operates in the pentode area, and therefore the constant current flows across the transistor QN3 even when the voltage of the terminal NDU changes. In this case, a current Icnt flowing across the N-channel MOS transistor QN1 can be, because of the transistor QN1 operating in the triode area, expressed such as:

$$I_{cnt}=\beta[(V_{in}-Vth)V_{NDI}-0.5V_{NDI}^2] \quad (2)$$

where β is the constant implying a driving force of the MOS transistor, Vin is the voltage applied to the input IN, Vth is the threshold voltage of the N-channel MOS transistor QN1, and $V_{NDI}$ is the voltage of the terminal NDI.

Thus, the transistor QN1 flows the current proportional to the input voltage by performing a non-saturating operation, with the result that a current of a difference between the constant current generated in the constant current source and the current flowing across the transistor QN1, flows across the transistor QN2.

Next, the two sides of the formula (2) are differentiated by Vin, whereby a sensitivity of $I_{cnt}$ to Vin, i.e., a gain is obtained as follows:

$$dI_{cnt}/dVin=\beta V_{NDI} \quad (3)$$

Herein, the right side of the formula (3) is considered. The symbol β is the constant representing a driving force of the transistor, $V_{NDI}$ remains fixed irrespective of the operating point because of the N-channel MOS transistor QN3 flowing the current supplied from the constant current source 11 in the pentode area. Accordingly, the gain of this voltage/current converting circuit remains constant regardless of the operating point, and it is feasible to obtain a characteristic with a wood linearity in a range where the N-channel MOS transistor QN1 operates in the non-saturation area.

Herein, the current flowing across the N-channel MOS transistor QN3 is the current supplied by the constant current source 11, and hence a current value $I_0$ is given by:

$$I_0=0.5*\beta*(V_{cnt}-V_{NDI}-Vth)_2 \quad (4)$$

This formula is established (assuming that QN3 operates in the pentode area), and therefore, when giving 2*Vth as the voltage $V_{cnt}$, the following formula (5) is acquired:

$$V_{NDI}=Vth-(2I_0/\beta)_{1/2} \quad (5)$$

Further, if a value reflecting Vth, e.g., a value into which the threshold value is multiplied by the constant is used as $I_0$, $I_0$ can be expressed such as:

$$I_0=kVth \quad (6)$$

where k is the constant, so that the following formula (7) is obtained by combining the formulae (3), (5) and (6):

$$dI_{cnt}/d\text{Vin}=\beta \text{Vth}-(2k\beta \text{Vth})_{1/2} \qquad (7)$$

In the above formula (7), if, e.g., β increases, both a first term and a second term of the right side increase, and therefore a difference therebetween does not become so large. Thus, the terms fluctuating due to the process (or a temperature) such as β and Vth are contained, but nevertheless it operates in such a direction as to restrain a quantity of fluctuation by taking the difference therebetween, whereby the fluctuations in gain of the voltage/current converting circuit can be restrained.

Next, an output stage for fetching outside the current flowing across the transistor QN1 will be explained.

As discussed above, since the current proportional to the voltage of the input IN flows through the N-channel MOS transistor QN1 operating in the non-saturation area, thereby enabling the same current as this current to appear also at the output stage. Thus, the output current proportional to the input voltage can be obtained.

Therefore, in accordance with the first embodiment, the input IN is connected to the gate of the N-channel MOS transistor QN4 of the output stage as in the same way with the gate of the transistor QN1. The N-channel MOS transistor QN4 of this output stage is set under absolutely the same condition as the N-channel MOS transistor QN1 of the input stage, and, for this purpose, a drain voltage of the transistor QN4 may be equalized to a drain voltage of the transistor QN1.

An output of the operational amplifier 12 is connected to a gate of the N-channel MOS transistor QN5. A node ND1 is connected to a non-inverted input terminal of the operational amplifier 12, and a drain terminal ND0 of the transistor QN4 is connected an inverted input terminal thereof. Hence, supposing that, for example, a potential of the drain terminal ND0 is smaller than NDI, a potential of an output OP0 of the operational amplifier 12 increases, and the potential ND0 is raised toward $V_{DD}$ because of the transistor QN5 becoming more conductive. Reversely supposing that ND0 is higher in potential than NDI, the potential of the output OP0 of the operational amplifier 12 decreases, and the potential of ND0 is lowered toward GND. As a result of such an operation, this system is stabilized in terms of such a point that the potential of NDI is equal to the potential of ND0.

Thus, the transistors QN4, QN1 Come under absolutely the same condition, so that absolutely the same current as QN1 flows across the transistor QN4. and it follows that a voltage corresponding thereto appears at a gate of the gate-drain connected P-channel MOS transistor QP6.

In this embodiment, the current component proportional to the input voltage flows through the MOS transistor by use of the shunt circuit, and the drain voltage and the gate voltage of the MOS transistor of the output stage are so controlled as to be equal to that at the input stage, thereby obtaining the current component.

No resistor is needed for the output state in this circuit, and it is hard to receive the gain fluctuation influenced by the process.

Figure 2:
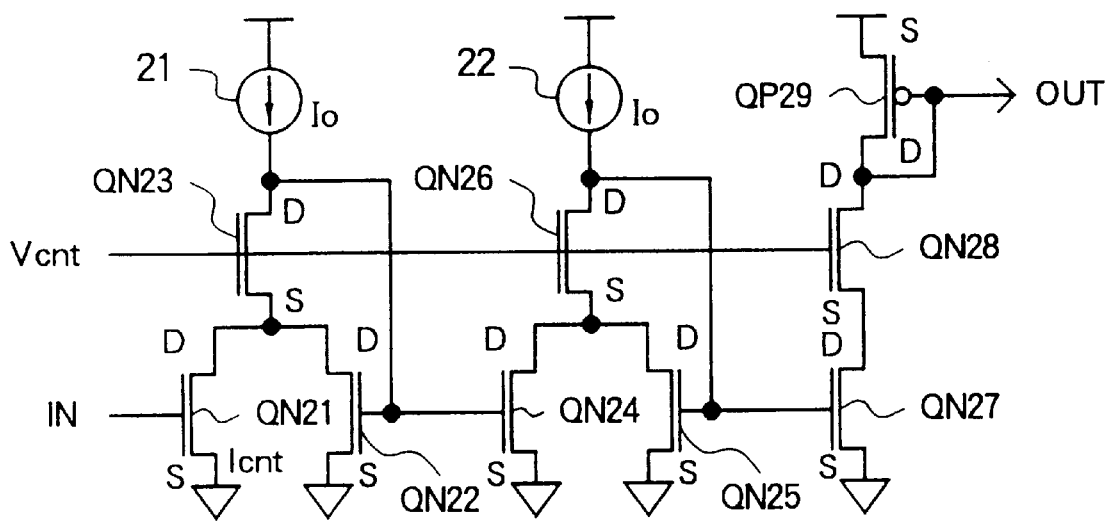
FIG. 2 is a circuit diagram showing a construction of a voltage/current converting circuit in a second embodiment of the present invention.

Next, another embodiment of the present invention will be discussed with reference to FIG. 2. In this embodiment, the current component proportional to the voltage of the input IN is fetched by use of two stages of shunt circuits.

Constructed the same as the shunt circuit shown in FIG. 1 are, to be specific, a circuit consisting of a constant current source 21, an N-channel MOS transistor QN23 with its drain connected to this constant current source 21 and two pieces of N-channel MOS transistors QN21, QN22 with their drains connected to a source of the transistor QN23, and a circuit constructed of a constant current source 22, an N-channel MOS transistor QN26 with its drain connected to this constant current source 22 and two pieces of N-channel MOS transistors QN24, QN25 with their drains connected to a source of QN26. A gate of the transistor QN22 and a gate of the transistor QN24 are connected in common. Further, a gate of the transistor QN21 is connected to the input terminal IN.

The constant current sources 21, 22 have the same characteristics.

Moreover, the output stage comprises P-channel MOS transistor QP29 and N-channel MOS transistors QN28, QN27 that are connected in series between the power supply and the ground. These transistors, however, correspond to the P-channel MOS transistor QP6 and the N-channel MOS transistors QN5, QN4 shown in FIG. 1.

A control voltage $V_{cnt}$ is applied in common to the gates of the transistors QN23, QN26 of the input stage and the gate of the transistor QN28 of the output stage as well.

Next, an operation of this circuit will be described.

The current flowing across the N-channel MOS transistor QN21 is, as explained in FIG. 1, proportional to the input voltage. Further, as in the case of FIG. 1, the N-channel MOS transistor QN23 with its gate controlled by the control voltage $V_{cnt}$, is connected between the constant current source 21 and the two shunt transistors QN21, QN22. Consequently, the transistor QN21 operates in the non-saturation area. Let $I_0$ be the current supplied by the constant current source and $I_{cnt}$, be the current flowing across QN21, and a current flowing across the MOS transistor QN22 is expressed such as $(I_0-I_{cnt})$.

Further, the N-channel MOS, transistors QN22, QN24 take a current mirror configuration, and, therefore, the same current as QN22 flows across the transistor QN24. At this time, with an existence of the N-channel MOS transistor QN26, a drain voltage of QN24 comes to a value substantially equal to that of QN21.

Herein, since the transistors QN24, QN25, QN26 and the constant current source 22 also constitute a shunt circuit, supposing that I0 be the current supplied by the constant current source 22 as in the same way with the constant Current source 21, the current flowing across the N-channel MOS transistor QN25 is given by subtracting the current flowing across QN24 from I0. Hence, the result is:

$$I_0-(I_0-I_{cnt})=I_{cnt}$$

Thus, the current flowing across QN25 becomes $I_{cnt}$ that is the same as the current flowing across QN21.

As a current mirror is constructed of the transistor QN25 f the shunt circuit and the transistor QN27 of the output stage, it follows that the current $I_{cnt}$ flows across the transistor QN27, too. Incidentally, the N-channel MOS transistor QN28 is inserted into the output stage, thereby making the drain voltage of QN27 approximate to that of the QN21.

A voltage corresponding to this current can be fetched out of a gate of the P-channel MOS transistor QP29.

Thus, in accordance with this embodiment, the current component proportional to the voltage of the input IN can be fetched to the output stage without using the operational amplifier unlike the first embodiment by the combination of the shunt circuit with the current mirror circuit.

Note that the constant current values of the constant Current sources 21, 22 can be differed in this embodiment. In this case, there must be established a fixed relationship between the current flowing across the transistor QN21 and the current flowing across the transistor QN25 owing to the shunt action and the current mirror action as well. If the constant current value of the constant current source 22 is larger than the constant current value of the constant current source 21, a kind of amplifying action can be actualized.

The conductivity of the transistor in each embodiment may be reversed, and the power supply may be exchanged for the ground.

Figure 3:
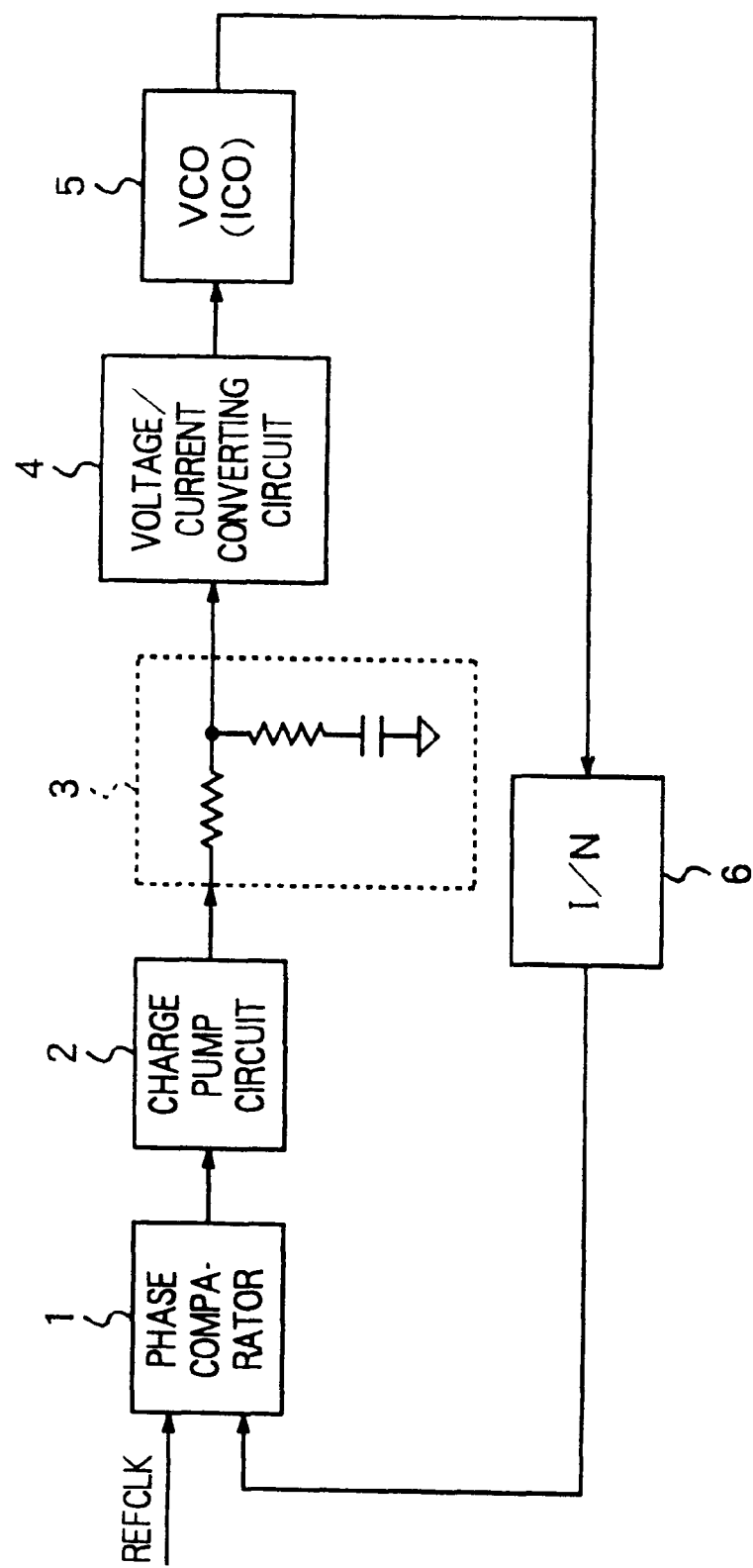
FIG. 3 is a block diagram illustrating an outline of a prior art PLL circuit.
Figure 4:
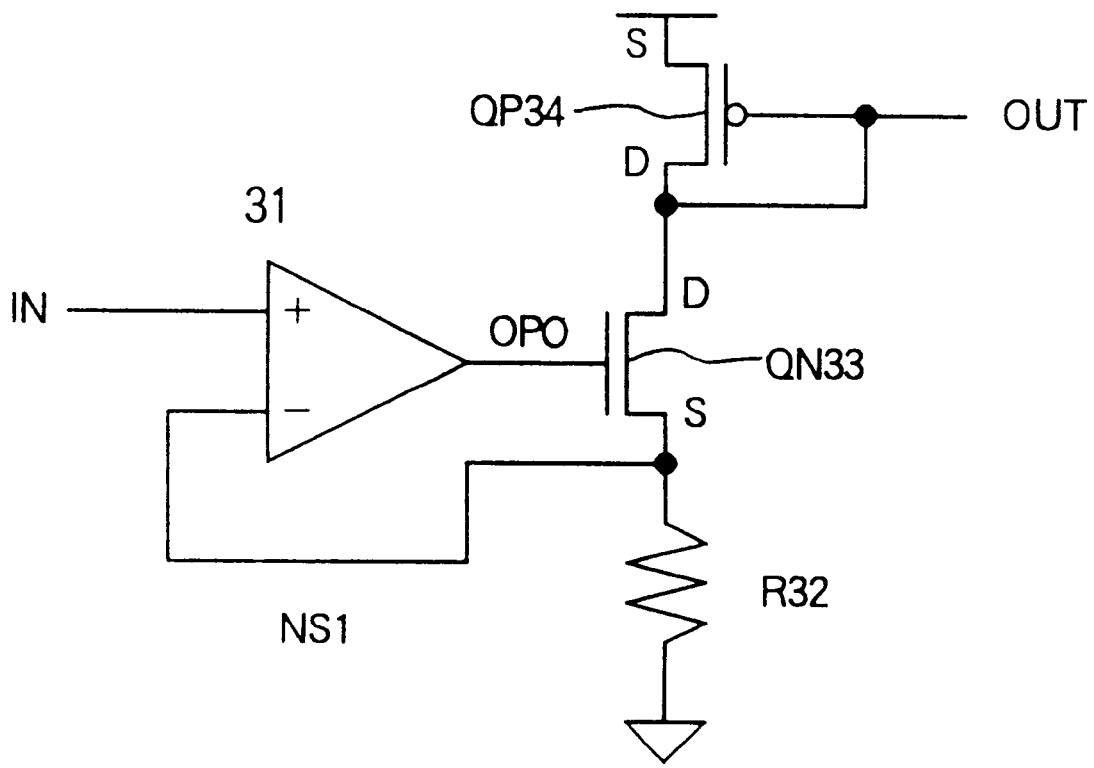
FIG. 4 is a circuit diagram showing a construction of a prior art voltage/current converting circuit.

Further, the voltage/current converting circuits in the first and second embodiments are preferably used for the PLL circuit shown in FIG. 3.

The PLL circuit with a difficulty of being influenced by the fluctuation in the gain due to the fluctuation in the process, can be thereby actualized.

It is possible to actualize the voltage/current converting circuit without using the chip external element, whose gain is hard to be influenced by fluctuations in process and in temperature and exhibits a characteristic of good linearity.

Furthermore, it is also feasible to obtain the PLL circuit that is hard to be influenced by the fluctuation in the gain due to the fluctuations in the process by incorporating the above-described voltage/current converting circuit.

What is claimed is:

1. A voltage/current converting circuit comprising:
    a constant current source for generating a constant current;
    a shunt circuit for flowing the constant current generated by said constant current source to first and second current paths, said first current path flowing a first current corresponding to an input voltage, and said second current path flowing a second current defined as a difference between the constant current and the first current; and
    an output circuit for taking out a third current bearing a predetermined ratio of the first current, said output circuit including a current control circuit for controlling an output current so that a difference between the first current and the output current becomes zero.

2. The voltage/current converting circuit according to claim 1, wherein said output circuit includes a current mirror circuit through which a current having the same value as the first current flows.

3. The voltage/current converting circuit according to claim 1, wherein said shunt circuit includes a first transistor of a first conductivity type, with its gate supplied with the input voltage, and a second transistor of the first conductivity type, for flowing a difference current between the constant current and the current flowing across said first transistor.

4. The voltage/current converting circuit according to claim 3, wherein a third transistor of the first conductivity type, for lowering a drain voltage of said first transistor so that said first transistor operates in a non-saturation area by a control signal, is inserted in between a connecting point of said first and second transistors of said shunt circuit and said constant current source.

5. The voltage/current converting circuit according to claim 3, wherein said output circuit includes a fourth transistor of the first conductivity type, having its gate supplied with the input voltage with the same characteristic as that of said first transistor.

6. The voltage/current converting circuit according to claim 5, wherein said current control circuit includes a fifth transistor of the first conductivity type and an operational amplifier for comparing a drain voltage of said first transistor coincident with a drain voltage of said fourth transistor by supplying a gate of said fifth transistor with an output signal of the comparison, whereby said fifth transistor lowers a drain voltage of said fourth transistor.

7. A voltage/current converting circuit comprising:
    a first constant current source for generating a first constant current;
    a first current path through which to flow a first current corresponding to an input voltage, said first current is a part of the first constant current generated by said first constant current source;
    a second current path through which to flow a second current defined as a difference between the first constant current and the first current;
    a second constant current source for generating a second constant current;
    a third current path through which to flow a third current defined as the same current as the second current flowing through said second current path; a shunt circuit having a fourth current path through which to flow a fourth current defined as a difference between the second constant current and the third current; and
    an output circuit for fetching the fourth current.

8. The voltage/current converting circuit according to claim 7, wherein said first and second current paths are first and second transistors of a first conductivity type with their drains connected in common,
    said third and fourth current paths are third and fourth transistors of the first conductivity type with their drains connected in common, and
    said output circuit is a fifth transistor of the first conductivity type having the same characteristic as said first transistor.

9. The voltage/current converting circuit according to claim 8, wherein each of said second, third, fourth and fifth transistors constitutes a current mirror circuit.

10. The voltage/current converting circuit according to claim 9, wherein sixth, seventh and eighth transistors of the first conductivity type with their gates each supplied with a control voltage, for lowering respective drain potentials, are inserted in between said first constant current source and a drain common connecting point of said first and second transistors, in between said second constant current source and a drain common connecting point of said third and fourth transistors, and in between said the drain of said fifth transistor and an output terminal.

11. A voltage/current converting circuit comprising:
    a first MOS transistor of a first conductivity type, with its source connected to a first power supply and its gate supplied with an input signal;
    a second MOS transistor of the first conductivity type, sharing a drain with said first MOS transistor and having its source connected to said first power supply;
    a first constant current circuit for supplying a constant current from a second power supply and
    a third MOS transistor of the first conductivity type, with its gate supplied with a control signal, said third MOS transistor being inserted in between said first MOS transistor and said first constant current circuit,
    wherein a connecting point between said third MOS transistor and said first constant current circuit is connected to the gate of said second MOS transistor, and
    a first current proportional to a voltage of the input signal flows across said first MOS transistor, and a current bearing a predetermined relationship with the—first— current is outputted.

12. The voltage/current converting circuit according to claim 11, further comprising:
- a fourth MOS transistor of the first conductivity type, with its gate supplied with the input signal and its source connected to said first power supply;
- a fifth MOS transistor of a second conductivity type which is an inverse type of the first conductivity type, with its source connected to said second power supply, short-circuited between a drain and a gate thereof;
- a sixth MOS transistor of the first conductivity type, inserted in between said fourth MOS transistor and said fifth MOS transistor; and
- an operational amplifier, having a non-inverted input connected to the drain of said first MOS transistor, an inverted input connected to the drain of said fourth MOS transistor, and an output supplied to the gate of said sixth MOS transistor, for executing control to equalize the drain voltage of said first MOS transistor to the drain voltage of said fourth MOS transistor.

13. The voltage/current converting circuit according to claim 11, wherein a voltage of the control signal has a value obtained by multiplying a threshold voltage of said first MOS transistor by a constant.

* * * * *